United States Patent [19]
Yap et al.

[11] Patent Number: 5,947,258
[45] Date of Patent: Sep. 7, 1999

[54] INTEGRATED CIRCUIT BOAT RETRIEVAL MECHANISM

[75] Inventors: Thean Loy Yap, Jalan Tenaga; Boon Hee Wee, Chai Chee Ave., both of Singapore

[73] Assignee: Advanced Micro Devices, Inc., Sunnyvale, Calif.

[21] Appl. No.: 08/991,979

[22] Filed: Dec. 17, 1997

[51] Int. Cl.$^6$ .................................................. B65G 37/00
[52] U.S. Cl. ............................... 198/346.1; 198/346.2; 198/345.1; 198/836.3; 198/721
[58] Field of Search .............................. 198/836.1, 837, 198/841, 346.1, 345.1, 468.9, 345.3, 867.13; 414/222, 721, 465.2, 465.1, 346.2

[56] References Cited

U.S. PATENT DOCUMENTS

| | | | |
|---|---|---|---|
| 2,740,515 | 4/1956 | Wilson | 198/867.13 |
| 4,014,428 | 3/1977 | Ossbahr | 198/345.3 |
| 4,449,277 | 5/1984 | Hasegawa et al. | 198/346.1 |
| 4,605,121 | 8/1986 | Wahren | 198/867.13 |
| 4,712,670 | 12/1987 | Burkhardt | 198/867.13 |
| 4,718,349 | 1/1988 | Wahren | 198/867.13 |
| 5,682,976 | 11/1997 | Jorgensen | 198/836.3 |

FOREIGN PATENT DOCUMENTS

| | | | |
|---|---|---|---|
| 3231-868 | 3/1984 | Germany | 198/841 |
| 649-631 | 2/1979 | U.S.S.R. | 198/836.3 |

Primary Examiner—William E. Terrell
Assistant Examiner—Khoi H. Tran
Attorney, Agent, or Firm—Monica H. Choi

[57] ABSTRACT

A boat retrieval mechanism, which move an output boat containing a tested integrated circuit package within an IC package handler of an IC package testing system, is designed for low maintenance and for easy maintenance. The boat retrieval mechanism of the present invention includes a carrier linear guide having a boat carrier mounted thereon for defining a path of travel of the boat carrier between a core testing unit and an IC package sorting unit. The boat carrier carries the output boat containing a tested IC package from the core testing unit to the sorting unit. A boat self-alignment mechanism disposed near the sorting unit holds the output boat substantially in a predetermined position when the output boat is at the sorting unit. In addition, a grounding wire is coupled between the boat carrier and a ground potential for ESD (Electro-Static Discharge) protection of any tested IC package carried by the boat retrieval mechanism of the present invention. A belt attached to the boat carrier moves the boat carrier, and a motor which drives this belt is located substantially far from the core testing unit for easy access during maintenance.

10 Claims, 4 Drawing Sheets

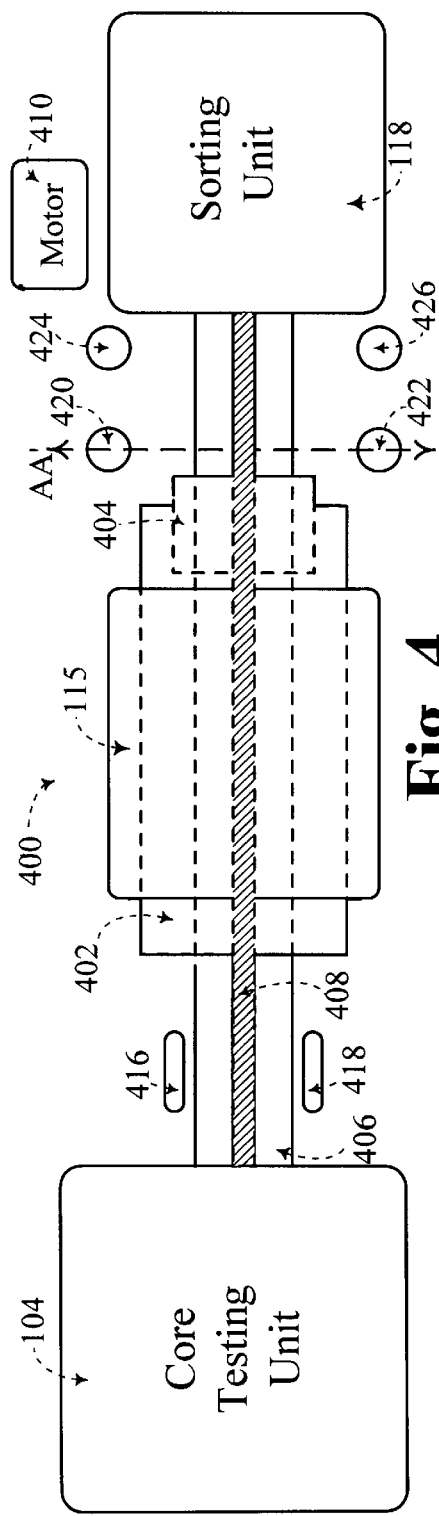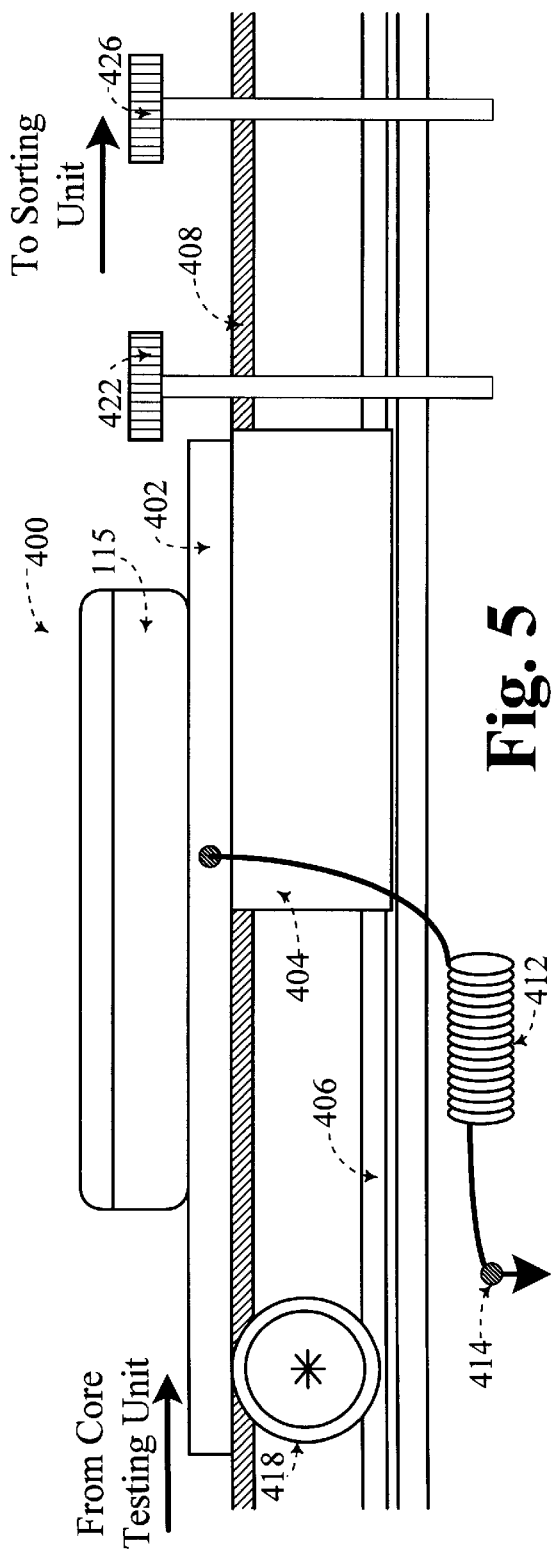

5,947,258

INTEGRATED CIRCUIT BOAT RETRIEVAL MECHANISM

TECHNICAL FIELD

This invention relates to integrated circuit handlers within an integrated circuit testing system, and more particularly to a design for an integrated circuit boat retrieval mechanism that requires low maintenance.

BACKGROUND OF THE INVENTION

Before distribution, an IC (Integrated Circuit) package is tested for proper functionality. In such testing, the pins on the IC package are coupled to test contacts of a testing system, and various measurements are performed from the test contacts to determine proper functionality.

An example of a IC package handler, within such an integrated circuit testing system, is the Delta Flex Test Handler, Model 1240, available from Delta Design, Inc., San Diego, Calif. Referring to FIG. 1, such an IC package handling system 100 includes an input mechanism 102, a core testing unit 104, and an output mechanism 106. The input mechanism 102 carries the IC packages to be tested into the core testing unit 104 and onto a storage boat 108, already carrying an IC package 110 in FIG. 1. The storage boat 108 carries the integrated circuit package 110 to be tested on a track 112 between the input mechanism 102, the core testing unit 104, and the output mechanism 106. In addition, the storage boat 108 carries the IC package 110 until the IC package reaches a desired temperature for testing.

Within the core testing unit 104, a core picker assembly 114 picks up an IC package from the storage boat 108 for testing. After testing, the core picker assembly 114 places the tested integrated circuit onto an output boat 115 within the output mechanism 106. The core testing unit 104 also includes a temperature control unit 116 for adjusting the temperature within the core testing unit 104 such that the integrated circuit may be tested for various environmental temperatures.

Once the testing of an IC package is complete, the output boat 115 receives the tested IC package from the core picker assembly 114, and the output mechanism 106 carries the tested IC package to a sorting unit 118. When a tested IC package is at the sorting unit 118, each IC package is sorted into a respective bin depending on the results of testing that IC package within the core testing unit 104. For example, if the result of testing an IC package is performance failure, that IC package is placed into a "bad chip" tube 120, and if the result is performance success, the package is placed into a "good chip" tube 122.

The present invention relates to a design for the output mechanism 106. FIG. 2 shows a prior art boat retrieval mechanism 200 for the output mechanism 106 of FIG. 1. The boat retrieval mechanism includes the output boat 115 carrying tested IC packages from the core testing unit 104, and carries the output boat 115 to the sorting unit 118. (Note, that elements having the same reference numeral in FIGS. 1 and 2 refer to the same element.)

Referring to FIG. 2, the prior art boat retrieval mechanism 200 includes a boat carrier 202 which carriers the output boat 115 from the core testing unit 104 after tested IC packages have been placed on the output boat 115. Furthermore, the boat carrier 202 carries the output boat 115 between the core testing unit 104 and the sorting unit 118. A belt 204 coupled to the boat carrier 202 moves the boat carrier 202 back and forth between the core testing unit 104 and the sorting unit 118. A motor 206 drives the belt 204 to move forward and backward from the core testing unit 104 to the sorting unit 118.

To maintain the path of travel of the output boat 115 along a linear path between the core testing unit 104 and the sorting unit 118, four pairs of roller bearings are disposed in that linear path. A first pair includes a first roller bearing 208 and a second roller bearing 210. A second pair includes a third roller bearing 212 and a fourth roller bearing 214. A third pair includes a fifth roller bearing 216 and a sixth roller bearing 218. Finally, a fourth pair includes a seventh roller bearing 220 and an eighth roller bearing 222. These roller bearings roll against a side wall of the boat carrier 202 to maintain the path of travel of the boat carrier 202 along a linear path.

FIG. 3A shows a cross section along line AA of the prior art boat retrieval mechanism 200. (Note, that elements having the same reference numeral in FIGS. 1–3 including FIGS. 3A and 3B refer to the same element.) The third roller bearing 212 is disposed on a first side 302 of the boat carrier 202, and the fourth roller bearing 214 is disposed on a second side 304 of the boat carrier 202. The eight roller bearings 208, 210, 212, 214, 216, 218, 218, 220, and 222 roll along the side walls of the boat carrier 202 and guide the path of the carrier 202 as the carrier 202 travels between those roller bearings.

The positions of the roller bearings 208, 210, 212, 214, 216, 218, 218, 220, and 222 are aligned to guide the boat carrier 202. FIG. 3B shows an example situation when the third roller bearing 212 and the fourth roller bearing 214 are not aligned properly. The third roller bearing 212 is disposed too near the boat carrier 202 on the first side 302, and the fourth roller bearing 214 is disposed too far from the boat carrier 202 on the second side 304. Thus, the third roller bearing 212 is subject to more wear, and may require replacement. The fourth roller bearing 214 may require to be realigned to a position more toward the second side 304 of the boat carrier. However, roller bearing replacement and realignment in the prior art boat retrieval mechanism 200 may be labor intensive and costly.

In addition, in the prior art boat retrieval mechanism 200, the motor 206 may be located near the core testing unit 104. Such a location makes maintenance of the motor inconvenient because the motor is difficult to access due to the framework of the core testing unit 104. Moreover, the prior art boat retrieval mechanism 200 may not have a grounding mechanism for providing a conductive path from the boat carrier 202 to a ground potential. Without a grounding mechanism, an IC package being carried on the output boat 115 may be electrostatically damaged when the output boat 115 carrying that IC package is on the boat carrier 202.

SUMMARY OF THE INVENTION

Accordingly, a primary object of the present invention is to redesign the prior art boat retrieval mechanism to overcome such shortcomings of the roller bearing alignment, the inconvenient location of the motor, and the lack of a conductive path to a ground potential.

In a general aspect of the present invention, a boat retrieval mechanism moves an output boat for carrying a tested integrated circuit package from a core testing unit to an integrated circuit sorting unit. A boat carrier carries the output boat between the core testing unit and the sorting unit. The boat retrieval mechanism of the present invention also includes a carrier linear guide, having the boat carrier mounted thereon, for defining a path of travel of the boat carrier between the core testing unit and the sorting unit. Furthermore, a boat self-alignment mechanism is disposed near the sorting unit for holding the output boat substantially in a predetermined position when the output boat is at the sorting unit.

The present invention can be used to particular advantage when the boat self-alignment mechanism further includes at least one pair of positioning roller bearings. Each positioning roller bearing of a pair is aligned to a respective side of the output boat when the output boat is at the sorting unit. Furthermore, one positioning roller bearing of a pair is coupled to a fixed spring and is mounted on a bearing linear guide.

In another aspect of the present invention, a grounding wire is coupled between the boat carrier and a ground potential for providing a conductive path from the boat retrieval mechanism to the ground potential.

In a further aspect of the present invention, a belt is coupled to the boat carrier for moving the boat carrier, and the motor which drives the belt is located substantially far from the core testing unit such that maintenance of this motor is more convenient.

These and other features and advantages of the present invention will be better understood by considering the following detailed description of the invention which is presented with the attached drawings.

BRIEF DESCRIPTION OF THE DRAWINGS

FIG. 3 includes FIGS. 3A and 3B.

FIG. 4 shows a design of a boat retrieval mechanism according to a preferred embodiment of the present invention;

FIG. 5 shows a side view of the boat retrieval mechanism of FIG. 4 according to a preferred embodiment of the present invention.

The figures referred to herein are drawn for clarity of illustration and are not necessarily drawn to scale. Moreover, elements having the same reference numeral in FIGS. 1–6 refer to the same element.

DETAILED DESCRIPTION

Figure 1:
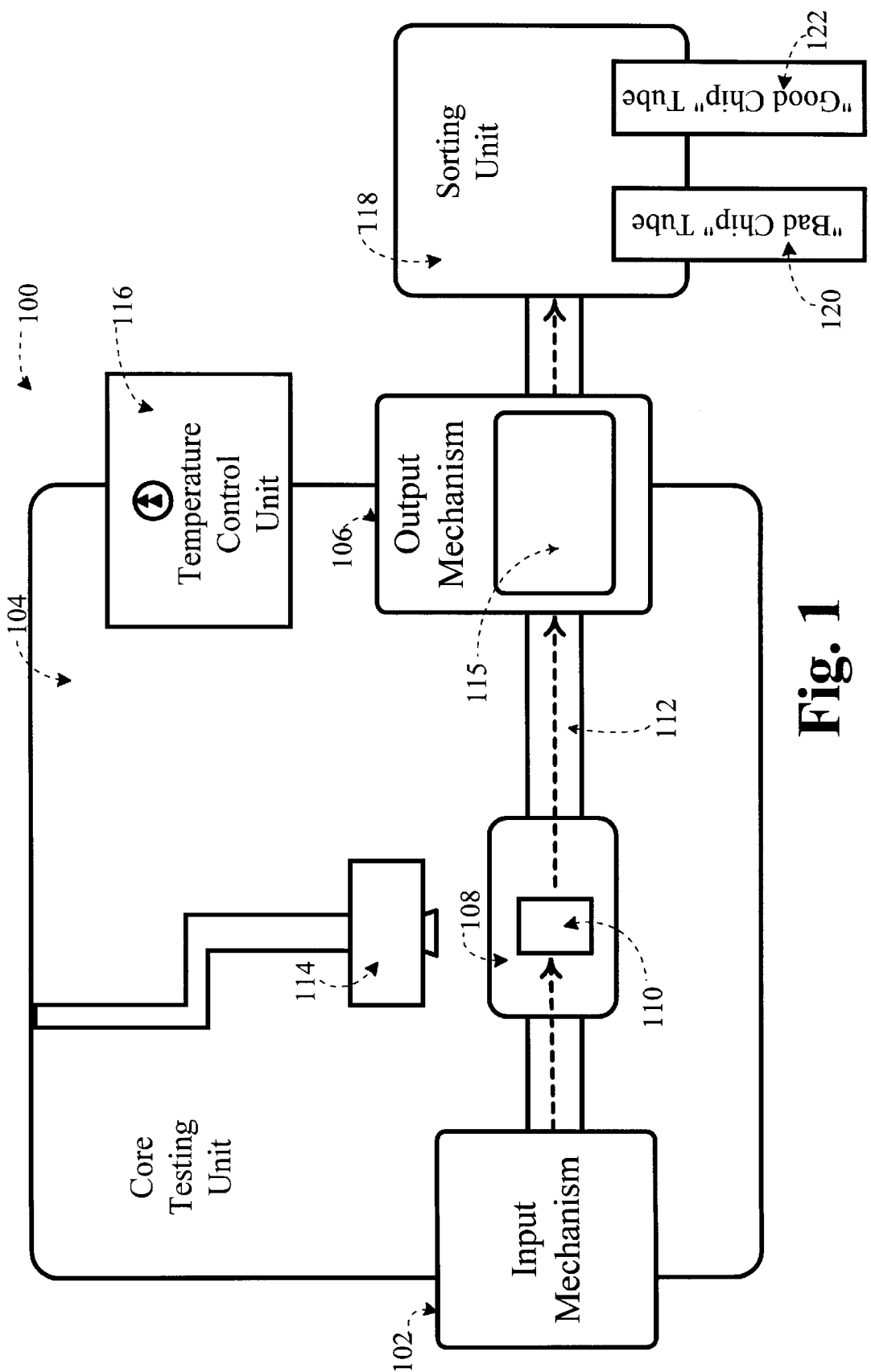
FIG. 1 shows an example IC package handling system within an IC package testing system.

Referring to FIGS. 4 and 5, a top view and a side view of a boat retrieval mechanism 400 according to a preferred embodiment of the present invention are respectively shown. This boat retrieval mechanism includes a boat carrier 402 for carrying the output boat 115 from the core testing unit 104 to the sorting unit 118. The boat carrier 402 is coupled to a carrier linear guide which includes a mounting block 404, onto which the carrier 402 is mounted, and a linear guiding path 406.

The bottom of the mounting block 404 fits within the linear guiding path 406, and the mounting block 404, carrying the boat carrier 402, is constrained to a linear path of travel between the core testing unit 104 and the sorting unit 118. With such a linear guide, the roller bearings 208, 210, 212, 214, 216, 218, 218, 220, and 222 of FIG. 2, which may be difficult and costly to replace or align, are no longer required for guiding the path of travel of the boat carrier 402.

A belt 408 is coupled to the boat carrier 402 and moves the boat carrier 402 back and forth from the core testing unit 104 to the sorting unit 118. A motor 410 which drives the belt to thus move back and forth is located substantially far from the core testing unit 104. Such a location of the motor 410 eases the maintenance to the motor 410 by providing easy access to the motor 410.

In addition, a grounding wire 412 is operatively connected between the boat carrier 402 and a ground potential 414. The grounding wire 412 provides a conductive path between the boat retrieval mechanism 400 and the ground potential 414.

The grounding wire 412 provides ESD (Electro-Static Discharge) protection. A charge build-up on the boat carrier 402 may be transferred to IC packages when the boat carrier 402 carries the output boat 115 with the tested IC packages. Such a charge transfer to the IC packages may electrostatically damage the IC packages. A conductive path between the boat carrier 402 and the ground potential 414 minimizes the risk of charge build-up on the boat carrier 402 which in turn minimizes the risk of electrostatic damage to the IC packages. In a preferred embodiment of the present invention, the grounding wire 412 is a coil wire which may easily move with the movement of the boat carrier 402.

Furthermore, the boat retrieval mechanism 400 of the present invention includes a first support roller bearing 416 and a second support roller bearing 418. If the boat carrier 402 were moved to be substantially at the core testing unit 104, the support roller bearings 416 and 418 are disposed below the boat carrier 402. The support roller bearings 416 and 418 support the boat carrier 402 when the core picker assembly 114 of the core testing unit 104 applies a downward force against the output boat 115 in placing a tested IC package onto the output boat 115.

When the output boat 115 is near the sorting unit 118, the output boat 115 may be required to be substantially at a predetermined position such that the sorting unit 118 may pick up any IC packages within the output boat 115 for sorting. Two pairs of positioning roller bearings are included in the boat retrieval mechanism 400 of the present invention to thus maintain the position of the output boat 115 at the sorting unit 118. A first such pair includes a first positioning roller bearing 420 and a second positioning roller bearing 422. A second such pair includes a third positioning roller bearing 424 and a fourth positioning roller bearing 426.

Figure 6:
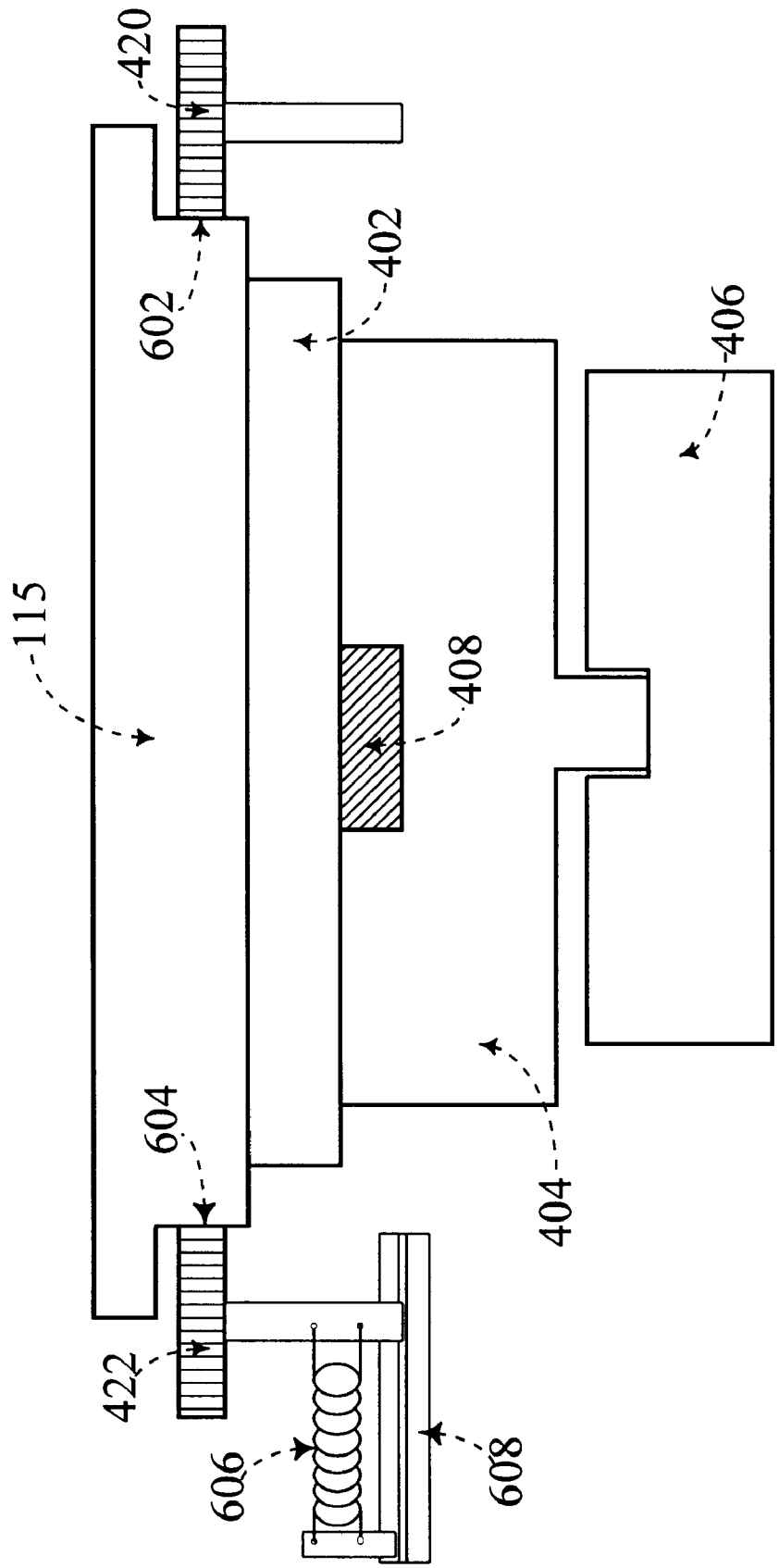
FIG. 6 shows a cross sectional view of the boat retrieval mechanism of FIG. 4 according to a preferred embodiment of the present invention.

FIG. 6 shows a cross-sectional view across the first pair of positioning roller bearings along line AA' of FIG. 4 when the boat carrier 402 is substantially near the sorting unit 118. (Note that elements having the same reference numeral in FIGS. 1–6 refer to the same element.) The first roller bearing 420 is disposed against a first side 602 of the output boat 115, and the second roller bearing 422 is disposed against a second side 604 of the output boat 115. One of the positioning roller bearings of the pair, the second positioning roller bearing 422 in the case of FIG. 6, is further coupled to a fixed spring 606. The compression force from the spring 606 against the second positioning roller bearing 422 maintains the output boat 115 substantially in a predetermined position when the output boat 115 is near the sorting unit 118.

Additionally, the second positioning roller bearing 422 is disposed within a bearing linear guide 608 which provides stability of movement for the second positioning roller bearing 422. Such stability may be needed when the direction of compression force on the second positioning roller bearing 422 from the spring 606 is unpredictable.

Figure 2:
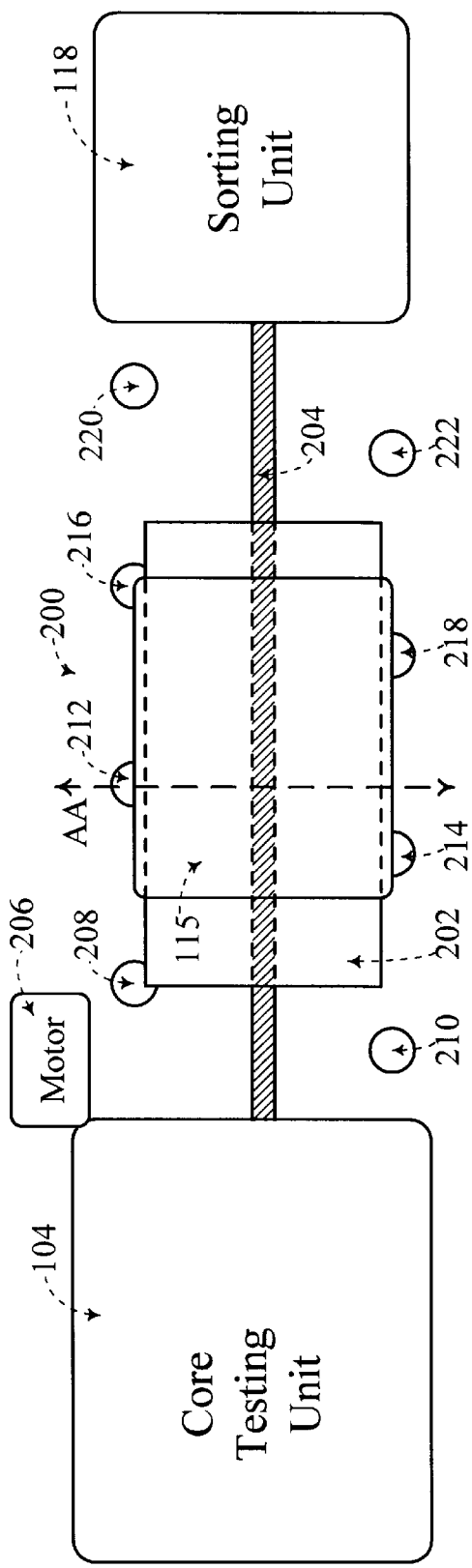
FIG. 2 shows the basic components of a prior art boat retrieval mechanism which is an example output mechanism of FIG. 1.
Figure 3B:
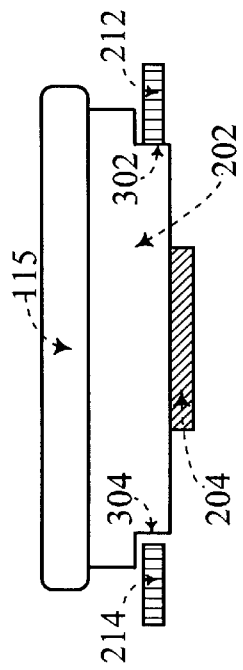
FIG. 3B shows a cross sectional view of the prior art boat retrieval mechanism of FIG. 2 when roller bearings are not properly aligned.
Figure 3A:
FIG. 3A shows a cross sectional view of the prior art boat retrieval mechanism of FIG. 2 when roller bearings are properly aligned.

In this manner, the boat retrieval mechanism 400 of the present invention includes a design that requires less maintenance and easier maintenance than the prior art boat retrieval mechanism 200 of FIG. 2. The carrier linear guide replaces the difficult to align roller bearings for guiding the path of travel of the boat carrier. In addition, a grounding wire is added to provide a conductive path between the boat carrier and a ground potential to ensure ESD (Electro-Static Discharge) protection. Furthermore, the motor which drives the belt that moves the boat carrier is located substantially far from the core testing unit such that the motor is easily accessible for maintenance. Additionally, positioning roller bearings keep the output boat carrying any tested IC packages substantially at a predetermined position when the output boat is at the sorting unit.

The foregoing is by way of example only and is not intended to be limiting. For example, the advantageous features of the present invention may be used with any other features and improvements of a boat retrieval mechanism. In addition, the shapes of all elements as illustrated in FIGS. 1–6 are by way of example only. For example, the shape of the output boat 115, the boat carrier 402, the positioning roller bearings 420, 422, 424, and 426, or the support roller bearings 416 and 418 may be different from that illustrated in FIGS. 4–6.

Moreover, it is to be understood that terms and phrases such as "top," "bottom," "below," "downward," "sidewall," and "side" as used herein refer to the relative location and orientation of various portions of elements of the present invention with respect to one another, and are not intended to suggest that any particular absolute orientation with respect to an external object is necessary or required. The invention is limited only as defined in the following claims and equivalents thereof.

We claim:

1. A method for carrying a tested integrated circuit package within an integrated circuit testing system, the method including the steps of:

A. placing said tested integrated circuit package, from a core testing unit of said integrated circuit testing system, into an output boat disposed on a boat carrier, said output boat being designed to carry said tested integrated circuit package;

B. contacting a bottom of the boat carrier with an outer circumferential surface of at least one support roller bearing, said at least one support roller bearing being disposed near said core testing unit to vertically support said boat carrier when a force is applied against the boat carrier as said core testing unit places said tested integrated circuit package into said output boat;

C. moving said boat carrier from said core testing unit to a sorting unit of said integrated circuit testing system, wherein said outer circumferential surface of said at least one support roller bearing rolls against said bottom of said boat carrier as said boat carrier moves from said core testing unit to said sorting unit;

D. linearly guiding a path of travel of said boat carrier as said boat carrier moves between said core testing unit and said sorting unit; and E. holding said output boat substantially in a predetermined position when the output boat is at the sorting unit.

2. The method of claim 1, wherein said step E includes the step of using at least one pair of positioning roller bearings, each positioning roller bearing of a pair aligning a respective side of the output boat when the output boat is at the sorting unit, and wherein one positioning roller bearing of a pair is coupled to a fixed spring and is mounted on a bearing linear guide.

3. The method of claim 1, further including the step of:

grounding the boat carrier by providing a conductive path from the boat retrieval mechanism to a ground potential.

4. The method of claim 1, wherein said step C includes the step of using a belt coupled to the boat carrier for moving said boat carrier, and of using a motor, coupled to the belt for driving the belt, wherein the motor is disposed substantially far from the core testing unit for easy access to the motor.

5. A method for carrying a tested integrated circuit package within an integrated circuit testing system, the method including the steps of:

A. placing said tested integrated circuit package, from a core testing unit of said integrated circuit testing system, into an output boat disposed on a boat carrier, said output boat being designed to carry said tested integrated circuit package;

B. contacting a bottom of the boat carrier with an outer circumferential surface of at least one support roller bearing, said at least one support roller bearing being disposed near said core testing unit to vertically support said boat carrier when a force is applied against the boat carrier as said core testing unit places said tested integrated circuit package into said output boat;

C. moving said boat carrier from said core testing unit to a sorting unit of said integrated circuit testing system, wherein said outer circumferential surface of said at least one support roller bearing rolls against said bottom of said boat carrier as said boat carrier moves from said core testing unit to said sorting unit;

wherein said step C includes the step of using a belt coupled to the boat carrier for moving said boat carrier, and of using a motor, coupled to the belt for driving the belt, wherein the motor is disposed substantially far from the core testing unit for easy access to the motor;

D. linearly guiding a path of travel of said boat carrier as said boat carrier moves between said core testing unit and said sorting unit;

E. holding said output boat substantially in a predetermined position when the output boat is at the sorting unit;

wherein said step E includes the step of using at least one pair of positioning roller bearings, each positioning roller bearing of a pair aligning a respective side of the output boat when the output boat is at the sorting unit, and wherein one positioning roller bearing of a pair is coupled to a fixed spring and is mounted on a bearing linear guide; and F. grounding the boat carrier by providing a conductive path from the boat retrieval mechanism to a ground potential.

6. An apparatus for carrying a tested integrated circuit package within an integrated circuit testing system, the apparatus comprising:

an output boat designed to carry said tested integrated circuit package that is placed into said output boat from a core testing unit of said integrated circuit testing system;

a boat carrier for carrying said output boat between said core testing unit and a sorting unit of said integrated circuit testing system;

at least one support roller bearing, disposed near said core testing unit, said at least one support roller bearing having an outer circumferential surface that contacts a bottom of the boat carrier to vertically support said boat carrier when a force is applied against the boat carrier as said core testing unit places said tested integrated circuit package into said output boat, and wherein said outer circumferential surface of said at least one support roller bearing rolls against said bottom of said boat carrier as said boat carrier moves from said core testing unit to said sorting unit;

a belt coupled to the boat carrier for moving the boat carrier;

a motor, coupled to the belt for driving the belt, wherein the motor is disposed substantially far from the core testing unit for easy access to the motor;

a carrier linear guide, having the boat carrier mounted thereon, for defining a path of travel of the boat carrier between the core testing unit and the sorting unit; and a boat self-aligmnent mechanism disposed near the sorting unit for holding the output boat substantially in a predetermined position when the output boat is at the sorting unit.

7. The apparatus of claim 6, wherein the boat self-alignment mechanism further includes:

at least one pair of positioning roller bearings, each positioning roller bearing of a pair aligning a respective side of the output boat when the output boat is at the sorting unit, and wherein one positioning roller bearing of a pair is coupled to a fixed spring and is mounted on a bearing linear guide.

8. The apparatus of claim 6, further comprising:

a grounding wire, operatively coupled between the boat carrier and a ground potential, for providing a conductive path from the boat retrieval mechanism to the ground potential.

9. An apparatus for carrying a tested integrated circuit package within an integrated circuit testing system, the apparatus comprising:

an output boat designed to carry said tested integrated circuit package that is placed into said output boat from a core testing unit of said integrated circuit testing system;

a boat carrier for carrying said output boat between said core testing unit and a sorting unit of said integrated circuit testing system;

at least one support roller bearing, disposed near said core testing unit, said at least one support roller bearing having an outer circumferential surface that contacts a bottom of the boat carrier to vertically support said boat carrier when a force is applied against the boat carrier as said core testing unit places said tested integrated circuit package into said output boat, and wherein said outer circumferential surface of said at least one support roller bearing rolls against said bottom of said boat carrier as said boat carrier moves from said core testing unit to said sorting unit;

a belt coupled to the boat carrier for moving the boat carrier;

a motor, coupled to the belt for driving the belt, wherein the motor is disposed substantially far from the core testing unit for easy access to the motor;

means for defining a path of travel of the boat carrier between the core testing unit and the sorting unit; and means for holding the output boat substantially in a predetermined position when the output boat is at the sorting unit.

10. The apparatus of claim 9, further comprising:

means for providing a conductive path from the boat retrieval mechanism to a ground potential.

* * * * *